(12) United States Patent
Sakimura et al.

(10) Patent No.: US 8,174,872 B2
(45) Date of Patent: May 8, 2012

(54) NONVOLATILE LATCH CIRCUIT

(75) Inventors: Noboru Sakimura, Tokyo (JP);
Tadahiko Sugibayashi, Tokyo (JP);
Ryusuke Nebashi, Tokyo (JP)

(73) Assignee: NEC Corporation, Tokyo (JP)

( * ) Notice: Subject to any disclaimer, the term of this patent is extended or adjusted under 35 U.S.C. 154(b) by 119 days.

(21) Appl. No.: 12/746,589

(22) PCT Filed: Dec. 3, 2008

(86) PCT No.: PCT/JP2008/071940
§ 371 (c)(1),
(2), (4) Date: Jul. 7, 2010

(87) PCT Pub. No.: WO2009/072511
PCT Pub. Date: Jun. 11, 2009

(65) Prior Publication Data
US 2010/0271866 A1 Oct. 28, 2010

(30) Foreign Application Priority Data
Dec. 6, 2007 (JP) .................. 2007-316397

(51) Int. Cl.
*G11C 11/00* (2006.01)
(52) U.S. Cl. ........ 365/158; 365/148; 365/171; 365/173; 977/933; 977/935
(58) Field of Classification Search .......... 365/48, 365/55, 62, 66, 74, 78, 80–93, 100, 130, 365/131, 148, 158, 171–173, 209, 213, 225.5, 365/230.07, 232, 243.5; 216/22; 257/295, 257/421, E21.665; 438/3; 428/810–816, 428/817–825.1, 826; 977/933–935
See application file for complete search history.

(56) References Cited

U.S. PATENT DOCUMENTS

2002/0034095 A1* 3/2002 Lu et al. .................. 365/158
2010/0208512 A1* 8/2010 Ueda ...................... 365/148

FOREIGN PATENT DOCUMENTS

| JP | 5-218850 A | 8/1993 |
|---|---|---|
| JP | 2002511631 A | 4/2002 |
| JP | 2003016773 A | 1/2003 |
| JP | 2003157671 A | 5/2003 |
| JP | 2004088469 A | 3/2004 |
| JP | 2004206835 A | 7/2004 |
| JP | 2005166170 A | 6/2005 |
| JP | 2007258460 A | 10/2007 |

OTHER PUBLICATIONS

International Search Report for PCT/JP2008/071940 mailed Jan. 6, 2009.

* cited by examiner

*Primary Examiner* — Richard Elms
*Assistant Examiner* — Harry W Byrne

(57) ABSTRACT

A nonvolatile latch circuit includes: first and second inverters cross-coupled to hold 1-bit data; first and second magnetoresistive elements each having first to third terminals; and a current supply circuitry configured to supply a magnetization reversal current for changing the magnetization states of the first and second maqnetoresistive elements in response to the 1-bit data. The power terminal of the first inverter is connected to the first terminal of the first magnetoresistive element and the power terminal of the second inverter is connected to the first terminal of the second magnetoresistive element. The current supply circuitry is configured to supply the magnetization reversal current to the second terminals of the first and second magnetoresistive elements. The third terminal of the first magnetoresistive element is electrically connected to the third terminal of the second magnetoresistive element.

8 Claims, 10 Drawing Sheets

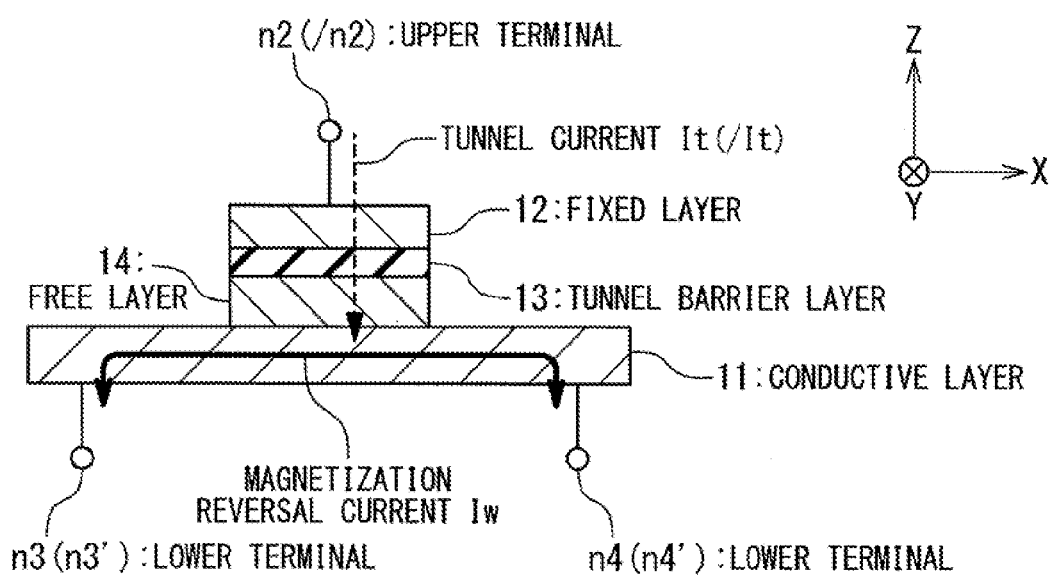

NONVOLATILE LATCH CIRCUIT

This application is the National Phase of PCT/JP2008/071940, filed Dec. 3, 2008, which claims the priority based on the Japanese Patent Application No. 2007-316397, filed on Dec. 6, 2007, the disclosure of which is incorporated herein in its entirety by reference.

TECHNICAL FIELD

The present invention relates to a nonvolatile latch circuit, and more particularly to a nonvolatile latch circuit having an MTJ (Magnetic Tunnel Junction) element as a memory element.

BACKGROUND ART

A lot of logical circuits are used in a large scale integration circuit (LSI). Logical circuits used in LSIs are broadly classified into logical gates which are used to process digital logical values, and typified by inverters, NAND gates and NOR gates; and bistable logical circuits used to temporarily hold and store digital logical values. Bistable logical circuits are typified by various latch circuits and various flipflop circuits formed by combining the latch circuits. In a typical LSI, combinations of a lot of logical gates and bistable logical circuits are integrated, and additional memory cores, such as random access memories (RAM) and read-only memories (ROM), are increasingly integrated.

In recent years, vast numbers of logical circuits are integrated within an LSI due to the advancement of the microtechnology in the manufacture process, and this raises problems of increases in the operating power due to speeding-up and in the standby power such as leak currents. One known solution to the problems is to stop the power supply to an unused circuit block or the whole LSI. However, this necessitates transfer of processed data to a nonvolatile storage device immediately before power-down, since initial values and intermediate processes values of data and processed data potentially disappear. This complicates the power control and increases the costs of system components. Furthermore, in a case of instantaneous power-down caused by power failure due to lighting, unintentional accidents and the like, an appropriate transfer procedure of the processed data may be successfully performed. In addition, initial values of latch circuits and the flipflops are indefinite, and this necessitates an initializing operation of the logical circuits at power-on, disadvantageously leading to a delay of the system booting.

To solve the above-mentioned problem, there are proposed schemes for holding the states of latch circuits and the flipflops even after the power-down. For example, a flipflop circuit using a virtual power source via a power switch in Japanese Patent Application Publication No. H05-218850. In this flipflop circuit, the power switch is turned on during the operation, and the flip-flop operates on both of the main power source and the virtual power source to achieve a high-speed operation. During standby, the power switch is turned off and the virtual power source is shut off to reduce the power consumption while keeping the state of the flipflop by the main power source.

Although the latch or flipflop using the power switch and the virtual power source requires no special manufacture process for memory elements, transistors with high threshold voltage needs to be used to prevent an increase in the gate leak current and the subthreshold leak current, because the main power source is not stopped. Furthermore, and the layout is complicated, since three kinds of power lines: main power lines, virtual power lines and ground lines are required; this makes the design using an automatic layout tool difficult. Accordingly, the design cost is disadvantageously increased.

In another approach, a method is proposed in which flipflops are combined with nonvolatile memory elements to solve the above-mentioned problem. For example, a circuit for storing the state of a flipflop in a ferroelectric capacitor is proposed in Japanese Patent Application Publication No. P2004-88469A. Since the ferroelectric capacitor is connected to the output of an inverter used in the flipflop, there is no need of separately providing writing means.

In a latch using a ferroelectric capacitor, however, it is difficult to integrate the latch in an interconnection layer, since a ferroelectric capacitor requires a high-temperature process in the manufacture. Therefore, the cell area of the flipflop is undesirably increased. Furthermore, the load capacity of each inverter used in the flipflop in the storing operation is increased. Further, the operating speed is lowered, since the writing time into a ferroelectric capacitor takes a few dozens of nanoseconds. In addition, the design using an automatic layout tool may be difficult, since a low-impedance plate line needs to be routed to one terminal of the ferroelectric capacitor.

In still another approach, a latch circuit for storing the state of a latch into an MTJ element is proposed in Japanese Translation of PCT Application No. 2002-511631, and Japanese Patent Application Publications No. P2003-157671A, and P2004-206835A. In this latch circuit, the MTJ element is inserted between an inverter and a power source, which form a latch, and writing means adapted to store the state of the latch into the MTJ element is provided. The number of times of writing into the MTJ element is substantially infinite (fifteenth power of 10 or more), and this allows performing a continuous storing operation. Another advantage is a high writing speed of a few nanoseconds or less. In addition, since the MTJ element is formed in an interconnection process, the MTJ element can be integrated immediately above a transistor. Accordingly, an overhead of the cell layout area is reduced.

The latch circuit disclosed in the above-mentioned patent document performs a write operation by flowing a magnetization reversal current through an interconnection layer located immediately below or above the MTJ element and reversing the magnetization direction of the MTJ element with a magnetic field generated by the magnetization reversal current occurs. However, in this latch circuit, the efficiency of generating the magnetic field by the magnetization reversal current is low and thus, a large magnetization reversal current (typically, a few miliamperes) is required. Consequently, the size of the transistor used in a circuit for feeding the magnetization reversal current is increased, resulting in an increase in the cell area of the latch circuit.

DISCLOSURE OF INVENTION

Therefore, an object of the present invention is to provide a technique for reducing a magnetization reversal current of a nonvolatile latch circuit having a magnetoresistive element.

In an aspect of the present invention, a nonvolatile latch circuit includes: first and second inverters cross-coupled to hold 1-bit data; first and second magnetoresistive elements each having first to third terminals; and a current supply circuitry configured to supply a magnetization reversal current for changing the magnetization states of the first and second magnetoresistive elements in response to the 1-bit data. The power terminal of the first inverter is connected to the first terminal of the first magnetoresistive element and the power terminal of the second inverter is connected to the first terminal of the second magnetoresistive element. The current supply circuitry is configured to supply the magnetization reversal current to the second terminals of the first and second magnetoresistive elements. The third terminal of the first magnetoresistive element is electrically connected to the third terminal of the second magnetoresistive element.

The present invention effectively reduces the magnetization reversal current of a nonvolatile latch circuit having a magnetoresistive element.

BRIEF DESCRIPTION OF DRAWINGS

FIG. 2C is a sectional view illustrating another example of the configuration of the MTJ element;

PREFERRED EMBODIMENTS OF INVENTION (First Embodiment)

Figure 1:
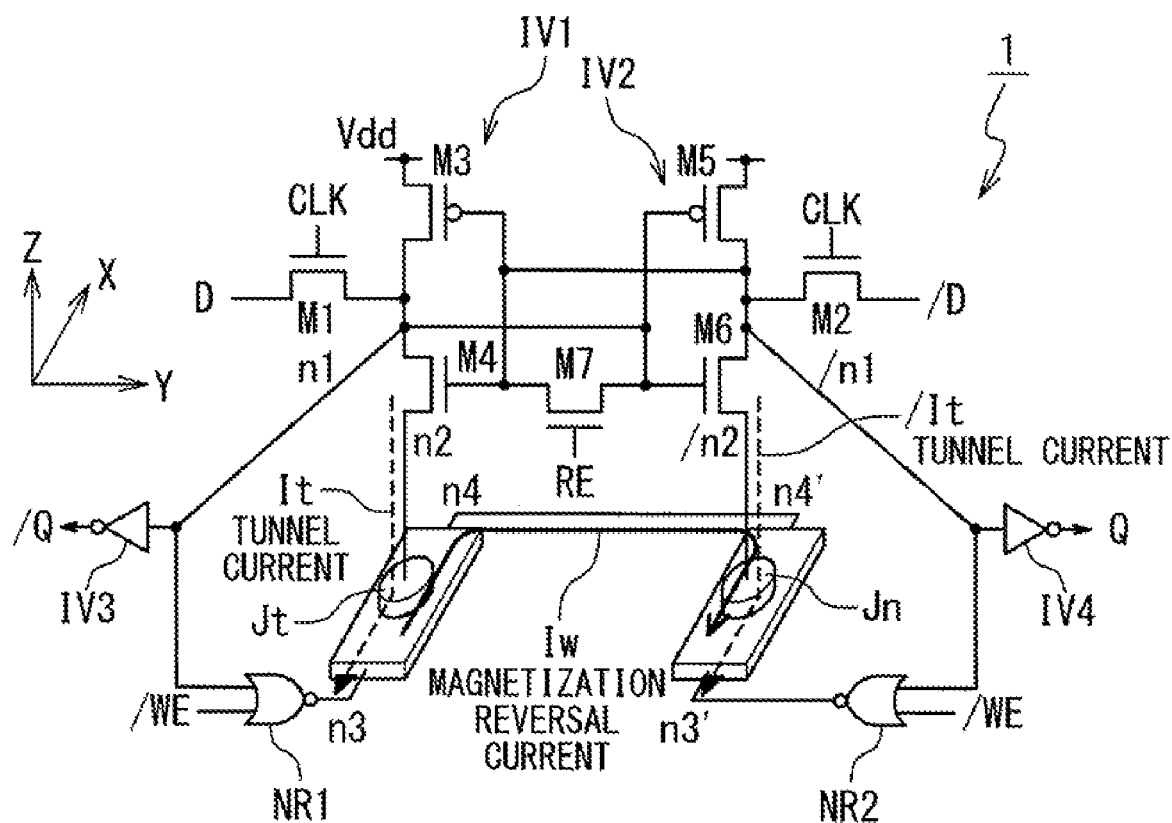
FIG. 1 is a circuit diagram illustrating the configuration of a nonvolatile latch circuit in a first embodiment of the present invention.

FIG. 1 is a basic configuration view illustrating a nonvolatile latch circuit 1 in a first embodiment of the present invention. The nonvolatile latch circuit 1 includes two MTJ elements Jt, Jn, NMOS transistors M1, M2, M4, M6, M7, PMOS transistors M3, M5, NOR gates NR1, NR2 and inverters IV3, IV4.

The MTJ elements Jt and Jn are used to store data in the nonvolatile latch circuit 1 when power is not supplied to the nonvolatile latch circuit 1. In this embodiment, the MTJ elements Jt and Jn are configured as a three terminal element. Specifically, the MTJ element Jt includes an upper terminal n2 and two lower terminals n3, n4, and the MTJ element Jn includes an upper terminal /n2 and two lower terminals n3', n4'. The lower terminals n4 and n4' of the MTJ elements Jt and Jn are connected to each other through an interconnection. As described later, a tunnel current It passing through the MTJ formed within the MTJ element Jt flows from the upper terminal n2 to the lower terminal n3, while a tunnel current /It passing through the MTJ formed within the MTJ element Jn flows from the upper terminal /n2 to the lower terminal n3'. Meanwhile, a magnetization reversal current Iw flows between the lower terminal n3 of the MTJ element Jt and the lower terminal n3' of the MTJ element Jt.

The MOS transistors M3 to M6 configure two cross-coupled inverters IV1, IV2 (that is, the output of one inverter is connected to the input of the other inverter). A latch is formed by these two inverters IV1 and IV2. Power terminals on the power source side of the inverters IV1, IV2 (that is, the sources of the PMOS transistors M3 and M5) are connected to a power line' having a power supply level Vdd. Power terminals on the ground side of the inverters IV1, IV2 (that is, the sources of the NMOS transistors M4 and M6) are connected to the upper terminals n2 and /n2 of the MTJ elements Jt and Jn, respectively. The drains of the PMOS transistor M3 and the NMOS transistor M4 are connected to a node n1 and the drains of the PMOS transistor M5 and the NMOS transistor M6 are connected to a node /n1. Furthermore, the node n1 is commonly connected to the gates of the PMOS transistor M5 and the NMOS transistor M6, and the node /n1 is commonly connected to the gates of the PMOS transistor M3 and the NMOS transistor M4. The node n1 functions as the output of the inverter IV1 as well as the input of the inverter IV2. Similarly, the node /n1 functions as the output of the inverter IV2 as well as the input of the inverter IV1.

The NMOS transistor M7 is connected between the outputs of the inverters IV1 and IV2 (that is, the nodes n1, /n1) to short-circuit the outputs of the inverters IV1 and IV2 in response to a recall enable signal RE. When the recall enable signal RE is activated (that is, pulled up to the "High" level), the nodes n1 and /n1 are electrically connected to each other. In contrast, when the recall enable signal RE is deactivated, the nodes n1 and /n1 are electrically isolated from each other.

The NOR gate NR1 and NR2 function as a current supply circuitry for supplying the magnetization reversal current Iw for writing complementary data to the MTJ elements Jt and Jn. In detail, the NOR gate NR1 has a first input connected to the node n1 of the inverter IV1 and a second input for receiving a store enable signal /WE, and the output of the NOR gate NR1 is connected to the lower terminal n3 of the MTJ element Jt. Similarly, the NOR gate NR2 has a first input connected to the node /n1 of the inverter IV2 and a second input for receiving the store enable signal /WE, and the output of the NOR gate NR2 is connected to the lower terminal n3 of the MTJ element Jn. In response to data held on the nodes n1 and /n1, the output of one of the NOR gates NR1 and NR2 are set to the "High" level and the output of the other are set to the "Low" level, when the store enable signal /WE is activated (that is, pulled down to the "Low" level). This allows flowing the magnetization reversal current Iw in the direction in accordance with the data held in the nodes n1 and /n1 and complementary data are written into the MTJ elements Jt and Jn.

The NMOS transistors M1 and M2 function to feed input data D and /D to the latch formed of the inverters IV1 and IV2 to thereby rewrite date held in the latch. Here, the input data D and /D are complementary data. In detail, the NMOS transistor M1 has a gate for receiving a clock signal CLK, a first source/drain connected to the node n1 and a second source/drain for receiving the input data D. Similarly, the NMOS transistor M2 has a gate for receiving a clock signal CLK, a first source/drain connected to the node /n1 and a second source/drain for receiving the input data /D.

The inverters IV3, IV4 function to externally output output data Q and /Q. Here, the output data Q and /Q are complementary data. In detail, the inverter IV3 has an input connected to the node n1 of the inverter IV1 and outputs the output data Q from the output thereof. The inverter IV4 has an input connected to the node /n1 of the inverter IV2 and outputs the output data /Q from the output thereof.

Figure 2A:
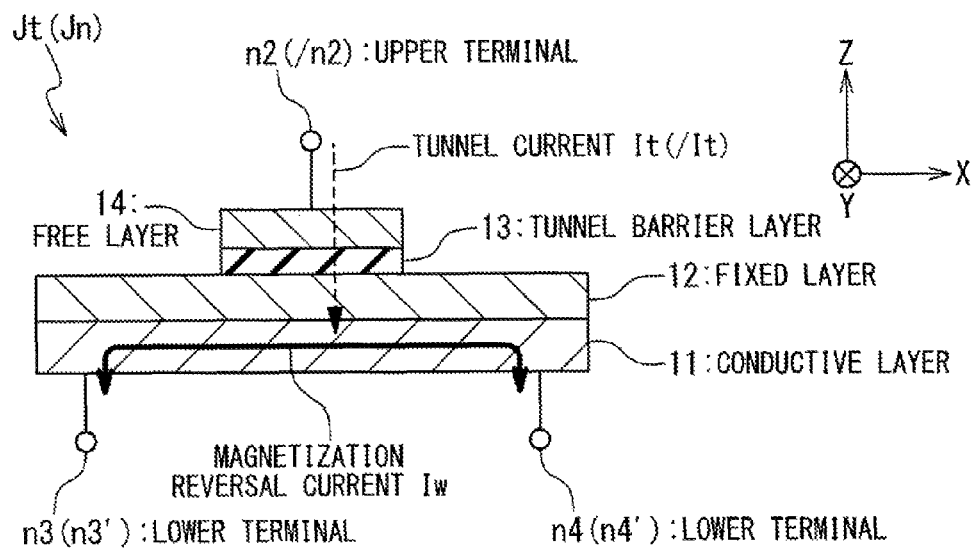
FIG. 2A is a sectional view illustrating an example of the configuration of an MTJ element.
Figure 2B:
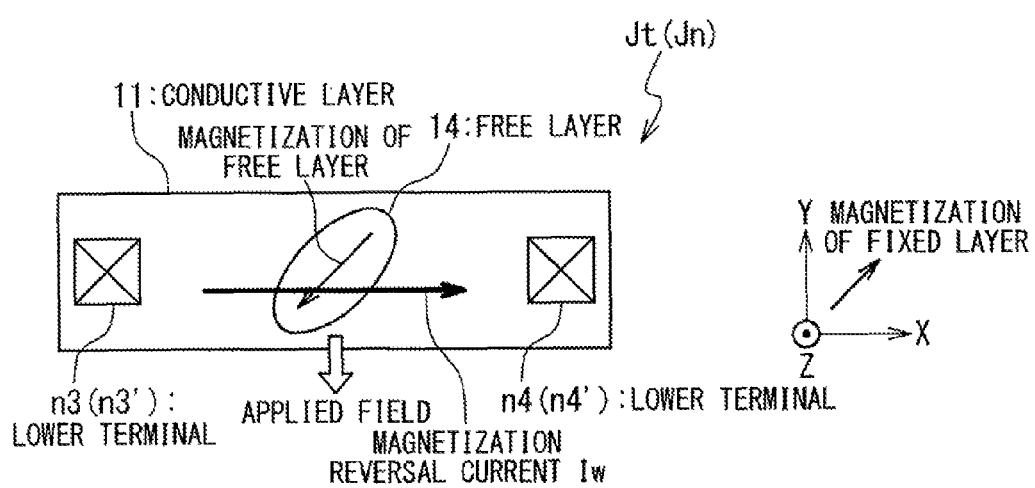
FIG. 2B is a plan view illustrating the configuration of the MTJ element in FIG. 2A.

FIG. 2A is a sectional view illustrating an example of the configuration of the MTJ elements Jt and Jn and FIG. 2B is a plan view illustrating the same. The MTJ elements Jt and Jn in FIGS. 2A and 2B each have a configuration in which the magnetization state of a magnetization free layer is reversed by a magnetic field generated by the magnetization reversal current Iw. In one embodiment, as shown in the sectional view of FIG. 2A, the MTJ elements Jt and Jn is each provided with a conductive layer 11, a magnetization fixed layer 12, a tunnel barrier layer 13 and a magnetization free layer 14. The magnetization fixed layer 12 is directly formed on the upper surface of the conductive layer 11 and the tunnel barrier layer 13 is formed on the upper surface of the magnetization fixed layer 12. The magnetization tree layer 14 is formed on the upper surface of the tunnel barrier layer 13. The magnetization fixed layer 12 is formed of a ferromagnetic film having a fixed magnetization and the magnetization free layer 14 is formed of a ferromagnetic film having a reversible magnetization. The lower terminals n3 and n3' of the MTJ elements Jt and Jn are each provided at the vicinity of one end of the conductive layer 11, and the lower terminals n4 and n4' are each provided at the vicinity of the other end of the conductive layer 11. On the other hand, the upper terminals n2 and /n2 of the MTJ elements Jt and Jn are each provided on the upper surface of the magnetization free layer 14. The lower terminals n3, n3', n4, n4' and the upper terminals n2 and /n2 are each typically formed as a via contact. As shown in FIG. 2B, the direction of the easy axes of the magnetization fixed layer 12 and the magnetization free layer 14 is inclined by 45° with respect to the X-axis direction (the extending direction of the conductive layer 11). It should be noted that the direction of the easy axes of the magnetization fixed layer 12 and the magnetization free layer 14 may be freely selected as long as they are not in parallel to the X-axis direction. The angle formed between the direction of the easy axes of the magnetization fixed layer 12 and the magnetization free layer 14 and the X-axis direction may be set to 30°, 45°, 60° or 90°, for example. In FIG. 2B, the magnetization of the magnetization fixed layer 12 is shown as being oriented in the direction inclined with respect to both of the +X direction and the +Y direction by 45° (or the upper right direction).

In the MTJ elements Jt and Jn configured as shown in FIGS. 2A and 2B, a magnetic field is applied to the magnetization free layer 14 in the +Y direction when the magnetization reversal current Iw flows through the conductive layer 11 in the +X direction. Thereby, the magnetization directions of the magnetization fixed layer 12 and the magnetization free layer 14 are oriented in parallel to each other and the MTJ elements Jt and Jn are placed into a low-resistance state (or data "0"). In contrast, the magnetic field is applied to the magnetization free layer 14 in the –Y direction when the magnetization reversal current Iw flows through the conductive layer 11 in the –X direction. Thereby, the magnetization directions of the magnetization fixed layer 12 and the magnetization free layer 14 are oriented in anti-parallel to each other and the MTJ elements Jt and Jn are placed into a high-resistance state (or data "1"). With the configurations shown in FIGS. 2A and 2B, the magnetization reversal current Iw can be reduced to, for example, 1 mA or less due to the extremely reduced distance between the' conductive layer 11 and the magnetization free layer 14 (for example, a dozens of nanometers).

As shown in FIG. 2C, the magnetization free layer 14 may be disposed on the upper surface of the conductive layer 11, the tunnel barrier layer 13 may be disposed on the upper surface of the magnetization free layer 14 and the magnetization fixed layer 12 may be disposed on the upper surface of the tunnel barrier layer 13. Such configuration allows further reducing the magnetization reversal current Iw, since the distance between the conductive layer 11 and the magnetization free layer 14 are extremely reduced.

Figure 3A:
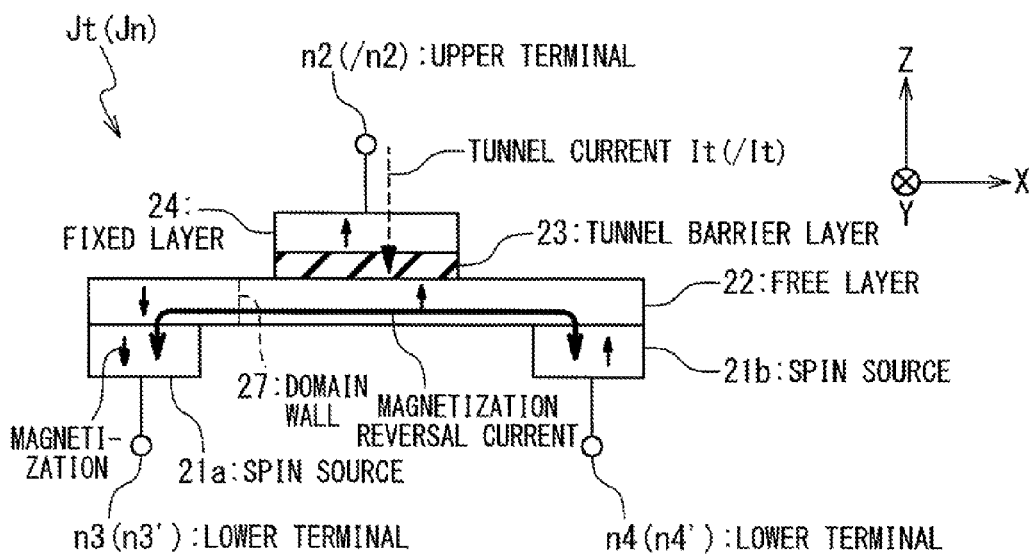
FIG. 3A is a sectional view illustrating still another example of the configuration of the MTJ element.
Figure 3B:
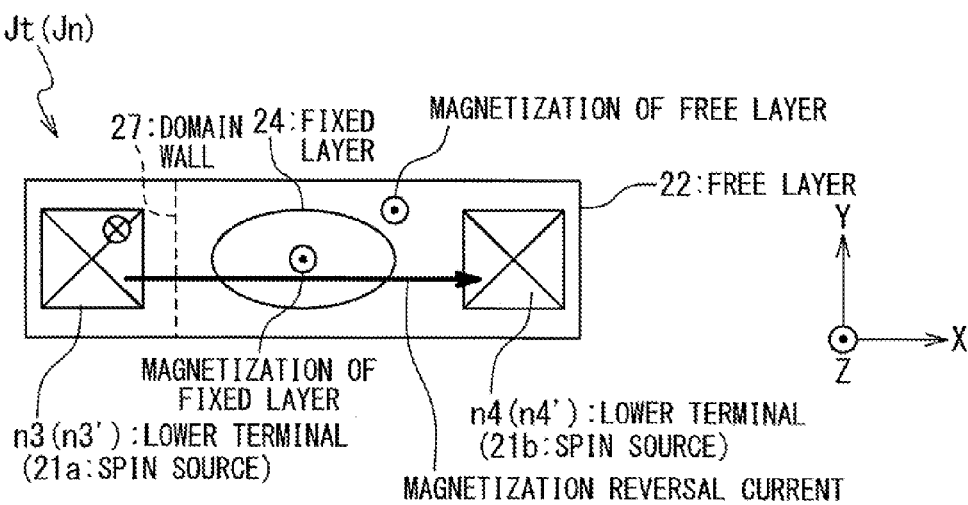
FIG. 3B is a sectional view illustrating the configuration of the MTJ element in FIG. 3A.

FIG. 3A is a sectional view illustrating another example of the configuration of the MTJ element Jt (Jn) and FIG. 3B is a plan view illustrating the same. The MTJ elements Jt and Jn in FIGS. 3A and 3B are each configured as a domain wall motion type MTJ element in which the magnetization of the magnetization free layer is reversed by spins given to electrons of the magnetization reversal current.

In one embodiment, as shown in FIG. 3A, the MTJ elements Jt and Jn are each provided with spin sources 21a, 21b, a magnetization free layer 22, a tunnel barrier layer 23 and a magnetization fixed layer 24. The spin sources 21a and 21b are coupled to the lower surface of the magnetization free layer 22 near the both ends thereof. The tunnel barrier layer 23 is laminated on the upper surface of the magnetization free layer 22 and the magnetization fixed layer 24 is laminated on the upper surface of the tunnel barrier layer 23. All of the magnetization directions of the spin sources 21a, 21b, the magnetization free layer 22 and the magnetization fixed layer 24 are oriented into vertical directions (Z-axis directions). The magnetization of the magnetization fixed layer 24 is fixed in the +Z direction. The magnetization of the spin source 21a is fixed in the −Z direction and the magnetization of the spin source 21b is fixed in the +z direction. The magnetization free layer 22 is divided into a domain in which magnetization is oriented in the upward direction and a domain in which magnetization is oriented in the downward direction across a domain wall 27 which is positioned between the spin sources 21a and 21b.

In the MTJ elements Jt and Jn in FIGS. 3A and 3B, electrons spin-polarized by the spin source 21b are injected into the magnetization free layer 22 when the magnetization reversal current Iw flows in the +X direction. By a spin torque effect of the injected spin-polarized electrons, the domain wall 27 moves in the –X direction and reaches the vicinity of the spin source 21a. As a result, the magnetization direction of the magnetization free layer 22 immediately below the magnetization fixed layer 24 is oriented in parallel to that of the magnetization fixed layer 24 and the MTJ elements Jt and Jn are placed into the low-resistance state (data "0"). In contrast, the domain wall 27 near the spin source 21a moves in the +X direction and reaches a vicinity of the spin source 21b when the magnetization reversal current Iw flows in the –X direction. As a result, the magnetization direction of the magnetization free layer 22 immediately below the magnetization fixed layer 24 are is oriented in anti-parallel to that of the magnetization fixed layer 24 and the MTJ elements Jt and Jn are placed into the high-resistance state (data "1").

The configuration of the MTJ elements shown in FIGS. 3A and 3B allows reducing the magnetization reversal current Iw down to about a few hundreds of microamperes, resulting in reduction of the area overhead of the current supply circuitry (in this embodiment, the NOR gates NR1 and NR2).

Figure 4:
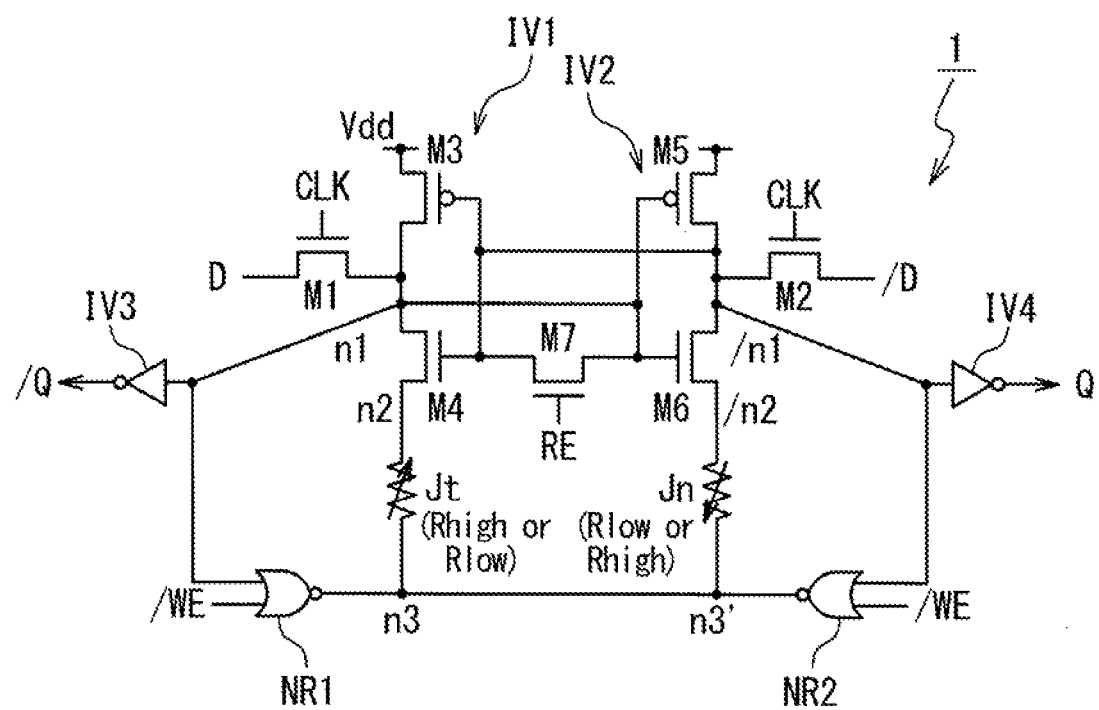
FIG. 4 is an equivalent circuit diagram of the nonvolatile latch circuit in the first embodiment.
Figure 5:
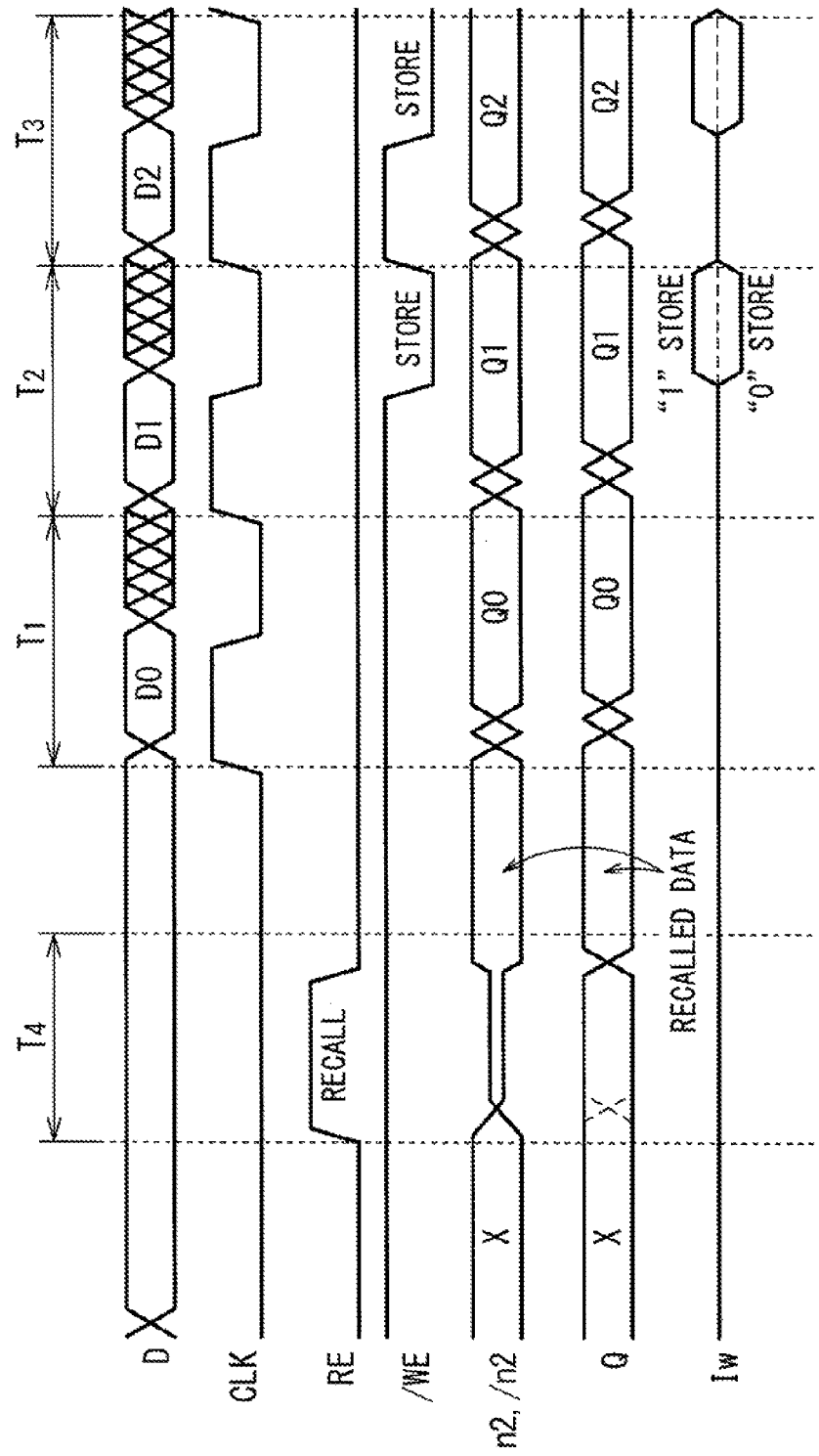
FIG. 5 is a timing chart illustrating operations of the nonvolatile latch circuit in the first embodiment.

The operation of the nonvolatile latch circuit 1 in the first embodiment will be described in detail. FIG. 4 is a diagram illustrating an equivalent circuit of the nonvolatile latch circuit 1 in the first embodiment in FIG. 1; in FIG. 4, the MTJ elements Jt and Jn are shown as variable resistors. Referring to FIG. 4 and FIG. 5, the operations of the nonvolatile latch circuit 1 in the first embodiment will be described below, where FIG. 5 is an operational timing chart of the equivalent circuit of FIG. 4.

Referring to FIG. 5, for performing a normal latch operation (a cycle $T_1$ in FIG. 5), the store enable signal (/WE) is deactivated, that is, pulled up to the "High" level. The lower terminals n3 and n3' of the MTJ elements Jt and Jn are grounded via the NMOS transistors (pull-down transistors) of the NOR gates NR1, NR2. The recall enable signal RE is also deactivated (that is, pulled down to the "Low" level) to turn off the NMOS transistor M7. When the clock signal CLK is pulled up to the "High" level, the NMOS transistors M1 and M2 are turned on, and the data held on the node n1 and /n1 are rewritten to the input data D, /D and outputted as they are as the output data Q and /Q (through operation). At this time, the voltage levels of the upper terminals n2 and /n2 of the MTJ elements Jt and Jn are approximately identical to the ground level. When the clock signal CLK is set to the "Low" level, the NMOS transistors M1 and M2 are turned off and data are held by the operation of the cross-coupled inverters IV1 and IV2 (holding operation). In principle, the nonvolatile latch circuit 1 in the first embodiment has a lower operating speed than the normal latch circuit due to an increased resistance of the MTJ elements Jt and Jn. However, the above-mentioned problem can be solved by adjusting the resistance value of the MTJ elements Jt and Jn to a smaller value than the ON resistance of the NMOS transistors M4 and M6 (approximately, from several hundreds of ohms to a few kilo-ohms). In other words, the nonvolatile latch circuit 1 in the first embodiment has substantially the same operating performance as that of a generally-used latch circuit.

In a storing operation (cycles $T_2$ and $T_3$ in FIG. 5), the store enable signal /WE is activated, that is, set to the "Low" level. In response to the activation of the store enable signal /WE, the NOR gates NR1 and NR2, which function as the current supply circuitry, supply the magnetization reversal current Iw between the lower terminal n3 of the MTJ element Jt and the lower terminal n3' of the MTJ element Jn to change the magnetization states of the MTJ elements Jt and Jn. The direction of the magnetization reversal current Iw is determined depending on the data to be held on the nodes n1 and /n1. For example, when the node n1 is set to the "High" level and the node /n1 is set to the "Low" level, the magnetization reversal current Iw flows from the lower terminal n3' of the MTJ element Jn toward the lower terminal n3 of the MTJ element Jt, and the magnetization directions of the respective magnetization free layers of the MTJ elements Jt and Jn are set so that the MTJ element Jt is placed into the high-resistance state (Rhigh) and the MTJ element Jn is placed into the low-resistance state (Rlow). In contrast, when the node n1 is set to the "Low" level and the node /n1 is set to the "High" level, the magnetization reversal current Iw flows from the lower terminal n3 of the MTJ element Jt toward the lower terminal n3' of the MTJ element Jn, and the magnetization directions of the respective magnetization free layers of the MTJ elements Jt and Jn are set so that the MTJ element Jt is placed into the low-resistance state and the MTJ element Jt is placed into the high-resistance state. When the magnetization reversal current Iw is supplied, the voltage levels on the lower terminals n3 and n3' are temporarily raised above the ground voltage; however, the increase in the voltage levels can be easily reduced below a static noise margin of the inverters IV1 and IV2. For example, a commonly-used NOR gate includes two PMOS transistors connected in series between the output node and the power terminal on the power source side and two NMOS transistors connected in parallel between the output node and the power terminal on the ground side. In the storing operation, the serially-connected PMOS transistors of one of the NOR gates NR1 and NR2 and the parallel-connected NMOS transistors of the other of the NOR gates NR1 and NR2 are placed into the ON state at the same time. Since the ON resistance of the serially-connected PMOS transistors is five to six times as high as the parallel-connected NMOS transistors, the voltage level of the lower terminal n3 of the MTJ element Jt and the lower terminal n3' of the MTJ element Jn can be reduced down to approximately Vdd/5 or less. Thus, the cross-coupled inverters IV1 and IV2, which function as the latch, successfully keep the date held on the nodes n1, /n1.

It should be noted that the store enable signal /WE is activated at a falling edge of the clock signal CLK (that is, at the moment to hold data) in FIG. 5. When the magnetization reversal current Iw is supplied at such timing, the latched data do not change, and thus the magnetizations of the MTJ elements Jt and Jn are successfully set surely in desired directions. However, the activation timing of the store enable signal /WE is optional, not limited to the timing shown in FIG. 5. For example, the magnetization reversal current Iw may be supplied to the MTJ elements Jt and Jn at a rising edge of the clock signal CLK, that is, at the timing when the nonvolatile latch circuit 1 performs the through operation.

In a recall operation (cycle T4), the recall enable signal (RE) is activated ("High" level) in a state where the clock signal (CLK) is set to the "Low" level, and the NMOS transistor M7 is turned on, that is, the input and output of the cross-coupled inverters IV1 and IV2 are short-circuited with each other. At this time, the voltage levels of the nodes n1 and /n1 are set to intermediate levels between the power potential Vdd and the ground potential. The voltage levels V(n1) and V(/n1) on the nodes n1 and /n1 change as follows according to the resistance values of the MTJ elements Jt and Jn (that is, magnetization state).

(i) When the MTJ element Jt is in the high-resistance state and the MTJ element Jn is in the low-resistance state, $$V(n1)>V(/n1). \tag{1}$$

(ii) When the Jt is in the low-resistance state and the' Jn is in the high-resistance state, $$V(n1)<V(/n1). \tag{2}$$

Accordingly, 1-bit data stored as the magnetization states of the MTJ elements Jt and Jn can be recalled to the nodes n1 and /n1 as complementary voltages. When the recall enable signal RE is pulled down to the "Low" level, the NMOS transistor M7 is turned off and the potential difference between the nodes n1 and /n1 is amplified to a logical amplitude by a forward amplifying effect of the cross-coupled inverters IV1 and IV2. That is, one of the nodes n1 and /n1 is set to the "High" level and the other is set to the "Low" level. The above-mentioned recall operation is often performed at the power-on. Thereby, the 1-bit data held in the MTJ elements Jt and Jn is transferred to the latch formed of the inverters IV1 and IV2 and the state immediately before the power-off can be recalled.

One feature of the nonvolatile latch circuit 1 in this embodiment is a circuit configuration in which the lower terminals n9 and n4' of the MTJ elements Jt and Jn are connected by an interconnection. With such the configuration, the interconnections connected to the lower terminals n3 and n3' of the MTJ elements Jt and Jn and the interconnection connecting the lower terminals n4 and n4' are also used for both of the power line (ground line) for pulling down the nodes n1 and /n1 and the interconnection for flowing the magnetization reversal current Iw. With the circuit configuration in FIG. 4, the interconnections connected to the lower terminals n3 and n3' of the MTJ elements Jt and Jn and the interconnection connecting the lower terminals n4 and n4' are grounded when the storing operation is not performed, and have a voltage level near the ground potential (for example, approximately 0.1V) when the storing operation is performed to flow the magnetization reversal current Iw. Therefore, in both cases, the inverters IV1 and IV2 operate as the latch normally. And, a conductor through which the magnetization reversal current Iw flows can be incorporated into each of the MTJ elements Jt and Jn. Thus, the conductor through which the magnetization reversal current Iw flows can be made extremely closer to the magnetization free layers of the MTJ elements Jt and Jn, thereby reducing the magnetization reversal current Iw. As a result, the transistors forming the current supply circuitry (in the present embodiment, the NOR gates NR1 and NR2) for supplying the magnetization reversal current Iw can be reduced in size, thereby effectively reducing the area overhead.

Figure 6:
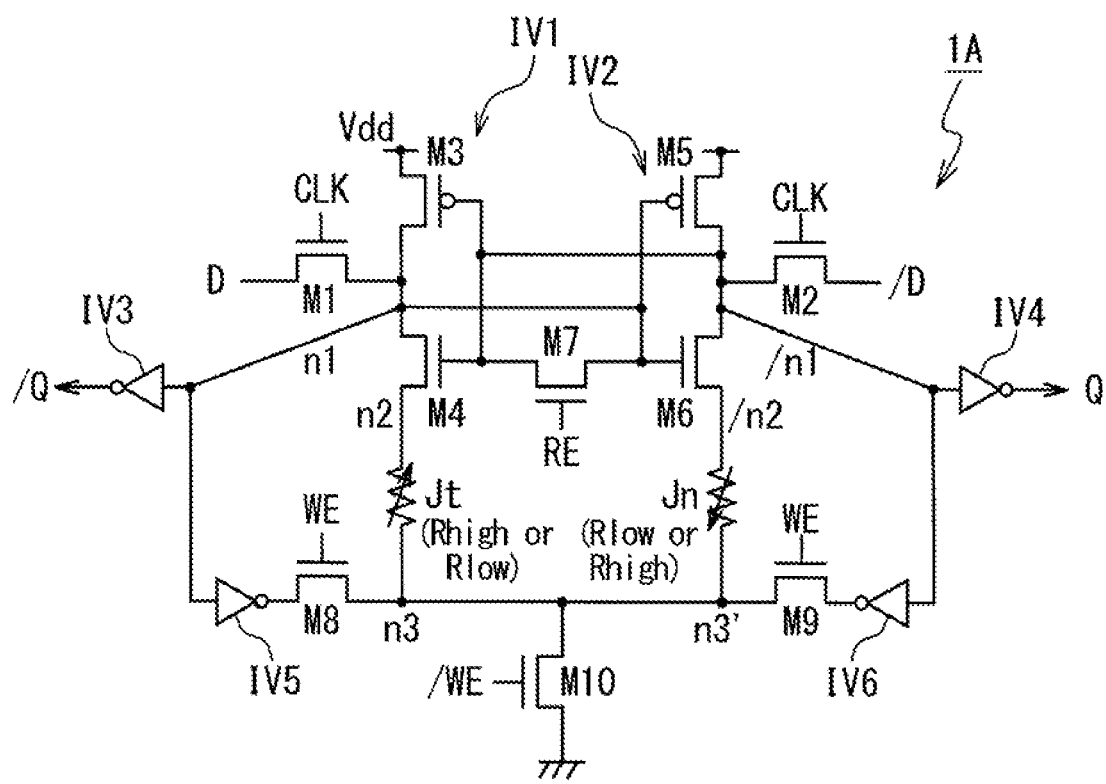
FIG. 6 is a circuit diagram illustrating another configuration of the nonvolatile latch circuit in the first embodiment of the present invention.

The circuit configuration of the nonvolatile latch circuit 1 is not limited to the configuration shown in FIG. 4. For example, FIG. 6 shows a configuration of a nonvolatile latch circuit 1A having inverters IV5, IV6 which function as a current supply circuitry for supplying the magnetization reversal current Iw; NMOS transistors M8 and M9 which function as current switches; and an NMOS transistor M10 which functions as a pull-down transistor. With the circuit configuration shown in FIG. 6, the nonvolatile latch circuit 1A can be operated so that the voltage levels on the lower terminals n3, n3' and the upper terminals n2 and /n2 are set closer to the ground level, as compared to the circuit configuration in FIG. 4. For example, in the storing operation, the NMOS transistors M8 and M9 are turned on and the NMOS transistor M10 is turned off so that the magnetization reversal current Iw flows between the lower terminal n3 of the MTJ element Jt and the lower terminal n3' of the MTJ element Jn in the direction according to data to be held in the nodes n1 and /n1. At this time, one of the NMOS transistors M8 and M9 is turned on in a linear region and the other is turned on in a region near a saturation region. Since the ON resistance in the saturation region is larger than the ON resistance in the linear region by approximately one digit, the voltage levels of the lower terminal n3 of the MTJ element Jt and the lower terminal n3' of the MTJ element Jn are set almost equal to the ground level. In contrast, in the normal operation and the recall operation (other than the storing operation), the NMOS transistor M10 is turned on and thereby the voltage levels of the lower terminal n3 of the MTJ element Jt and the lower terminal n3' of the MTJ element Jn are pulled down to the ground level.

Figure 7:
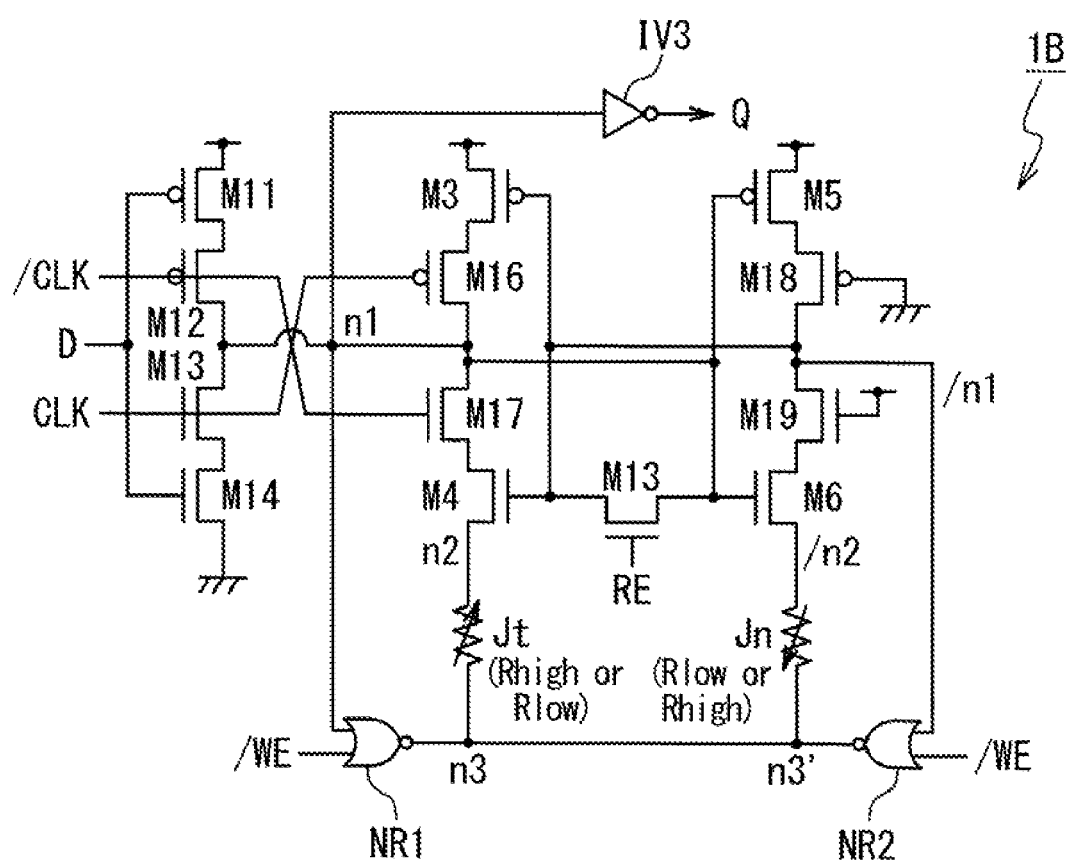
FIG. 7 is a circuit diagram illustrating still another configuration of the nonvolatile latch circuit in the first embodiment of the present invention.

FIG. 7 shows a circuit configuration of a nonvolatile latch circuit 1B configured as a latch circuit using a clocked inverter. The clocked inverter CIV includes PMOS transistors M11, M12 and NMOS transistors M13, M14. A PMOS transistor M16 and an NMOS transistor M17 are additionally provided for the inverter IV1 and thereby the inverter IV1 functions as a clocked inverter. A PMOS transistor M18 and an NMOS transistor M19 are additionally provided for the inverter IV2. The PMOS transistor M18 and the NMOS transistor M19 are turned on at all times and are used to match the combined ON resistance of the MOS transistors M3, M4, M16 and M17 forming the inverter IV1 and the combined ON resistance of the MOS transistors M5, M6, M18 and M19 forming the inverter IV2.

The nonvolatile latch circuit 1B in FIG. 7 performs a latch operation as follows: When the clock signal CLK is pulled up to the "High" level and a clock signal /CLK is pulled down to the "Low" level, a PMOS transistor M12 and an NMOS transistor M13 are turned on and the PMOS transistor M16 and the NMOS transistor M17 are turned off, resulting that inverted data of the input data D are transmitted to the node n1 and non-inverted data of the input data D are transmitted to the node /n1. The inverter IV3 outputs the inverted data of the data set on the node n1 (that is, the non-inverted data of the input data D) as the output data Q. When the clock signal CLK is pulled down to the "Low" level and the clock signal /CLK is pulled up to the "High" level, the MOS transistors M12, M13 are turned off and the MOS transistors M16, M17 are turned on, resulting in that the data are held on the nodes n1 and /n1. As in the circuit configuration in FIG. 4, the magnetization reversal current Iw is generated by the NOR gates NR1 and NR2.

The storing operation of the nonvolatile latch circuit 1B is the same as that of the nonvolatile latch circuit 1 in FIG. 4.

The recall operation of the nonvolatile latch circuit 1B is performed in a state where the clock signal CLK is in the "Low" level, the clock signal /CLK is in the "High" level and the recall enable signal RE is in the High level. In this state, the NMOS transistor M7 is turned on and the outputs of the cross-coupled inverters IV1, IV2 are short-circuited each other. Thereby, 1-bit data stored as the magnetization states of the MTJ elements Jt and Jn are called to the nodes n1 and /n1 as complementary voltage levels. Here, when the recall enable signal RE is placed into the "Low" level, the NMOS transistor M7 is turned off and the potential difference recalled to the nodes n1 and /n1 is amplified to the logical amplitude by the forward amplifying effects of the cross-coupled inverters IV1 and IV2, and then outputted.

Although the first embodiment of the present invention is described in detail, the present invention is not limited to the above-mentioned circuits (FIG. 1, FIG. 4, FIG. 6, and FIG. 7) and may be appropriately modified within the technical concept of the present invention. For example, although the above-mentioned nonvolatile latch circuits are configured as a high-through nonvolatile latch circuit, the above-mentioned nonvolatile latch circuits may be modified into a low-through nonvolatile latch circuit. Furthermore, for example, cell layout and interconnection connection may be optimally modified depending on the layout and cell arrangement of the nonvolatile latch circuit, and the magnetization directions of the magnetization fixed layers.

The structures of the MTJ elements Jt and Jn are not limited to those shown in FIGS. 2A to 2C, FIGS. 3A and 3B; a structure may be applied to the present embodiment, in which a conductive layer (or an interconnection layer) through which the magnetization reversal current flows is provided on the upper surface or the lower surface of the MTJ element in parallel to the plane of the MTJ element and the conductive layer is electrically connected to one terminal of the MTJ element.

Further, the MTJ elements Jt and Jn may be connected to the power terminals on the power source side of the inverters IV1 and IV2. That is, in FIG. 4, the sources of the NMOS transistors M4 and M6 are connected to the ground line, the upper terminal n2 of the MTJ element Jt is connected to a source of the PMOS transistor M3 and the upper terminal /n2 of the MTJ element Jn is connected to a source of a PMOS transistor. M4. The lower terminals n3 and n3' of the MTJ elements Jt and Jn are electrically connected to each other. At this time, it is desired to use NAND gates in place of the NOR gates NR1 and NR2.

(Second Embodiment)

In a second embodiment of the present invention, a nonvolatile latch circuit of the present invention is configured so as to operate as a delay flipflop (D-FF). A nonvolatile D flipflop circuit 1C in the second embodiment has a configuration in which a commonly-used master-slave typed D-FF is modified to use the high-through nonvolatile latch circuit 1 shown in FIG. 4 as a slave latch.

In detail, the nonvolatile D flipflop circuit 1C in the second embodiment includes a master latch 31, a slave latch 32 and inverters IV22 to IV24. The master latch 31 includes clocked inverters CI1, CI2 and an inverter IV21.

The clocked inverter CI1 includes PMOS transistors M21, M22, NMOS transistors M23 and M24. The input data D are supplied to the gates of the PMOS transistor M21 and the NMOS transistor M24. A non-inverted signal p1 of the clock signal CLK is inputted to the gate of the PMOS transistor M22 and the inverted signal /p1 of the clock signal CLK is inputted to the gate of the NMOS transistor M23. The output of the clocked inverter CI1 is connected to a node n5.

The clocked inverter CI2 includes PMOS transistors M25, M26, NMOS transistors M27 and M28. The input data D are supplied to the gates of the PMOS transistor M25 and the NMOS transistor M28. The inverted signal /p1 of the clock signal CLK is inputted to the gate of the PMOS transistor M26 and the non-inverted signal p1 of the clock signal CLK is inputted to the gate of the NMOS transistor M27. The clocked inverter CI2 has an input connected to a node n6 and an output connected to the node n5. The clocked inverter CI2 is cross-coupled with the inverter IV21. That is, the inverter IV21 has an input connected to the node n5 and an output connected to the node n6. The node n6 functions as the output terminal of the master latch 31.

The slave latch 32 has a similar configuration to that of the nonvolatile latch circuit 1 shown in FIG. 4. The output signal outputted from the node n6 of the master latch 31 is supplied to the node n1 through the NMOS transistor M1 and to the node /n1 through an inverter IV7 and the NMOS transistor M2. The non-inverted signal p1 of the clock signal CLK is supplied to the gates of the NMOS transistors M1 and M2. An inverted signal p2 of a (low-active) recall enable signal /RE is supplied to the NMOS transistor M7.

Figure 9:
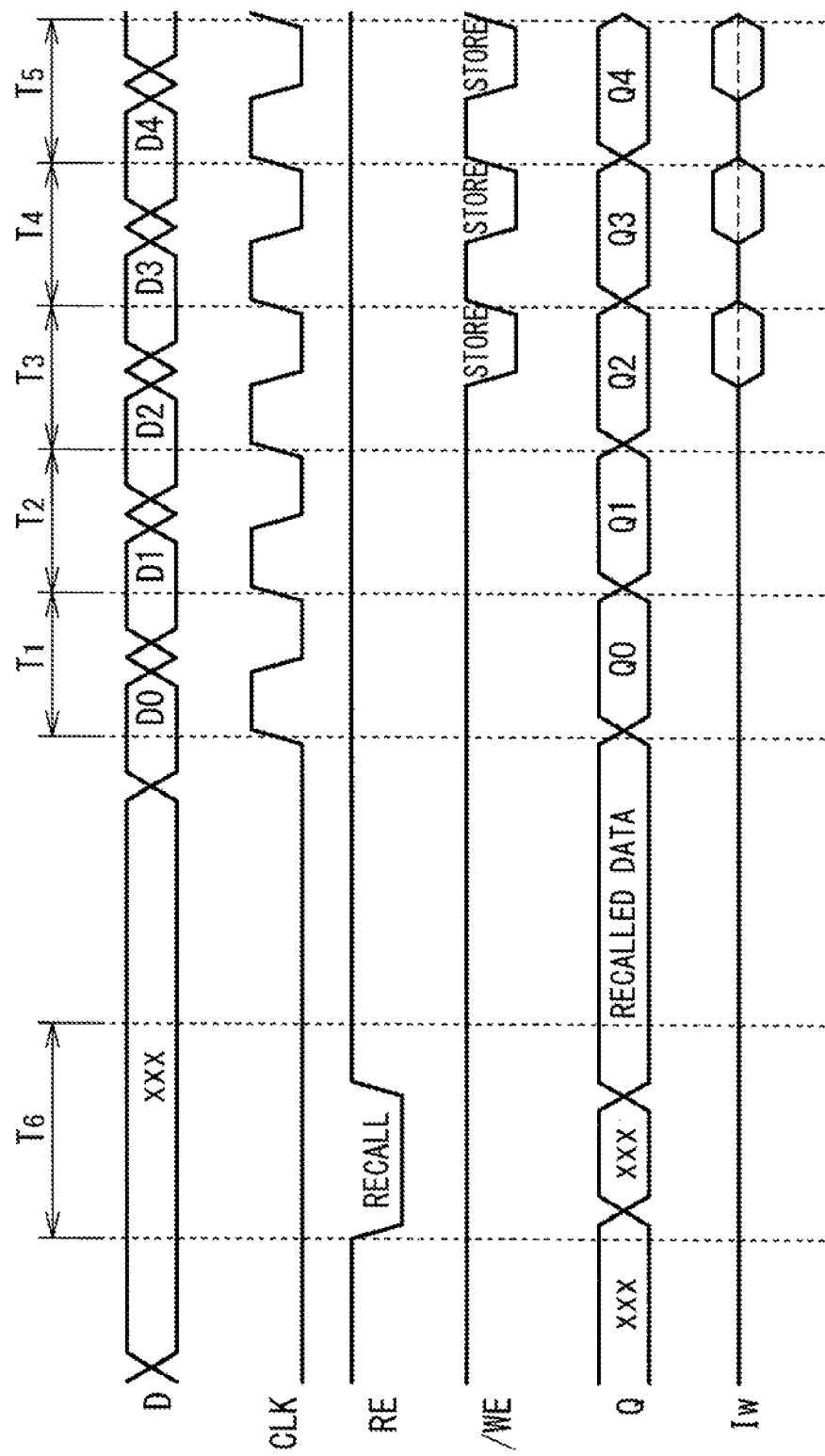
FIG. 9 is a timing chart illustrating operations of the nonvolatile D flipflop circuit in the second embodiment.

FIG. 9 is a timing chart illustrating the operation of the nonvolatile D flipflop circuit 1C in the second embodiment. The cycles $T_1$-$T_2$ in FIG. 9 correspond to the normal operation of the nonvolatile D flipflop circuit 1C, the cycles $T_3$-$T_5$ correspond to the storing operation and the cycle $T_6$ corresponds to a recall operation.

In the normal operation (cycles $T_1$-$T_2$), both of the store enable signal /WE and the recall enable signal /RE are set to be in a deactivated state (the "High" level). Thereby, the outputs of the NOR gates NR1 and NR2 are pulled down to the "Low" level and the NMOS transistor M7 is operated in the OFF state.

The clocked inverter CI1 of the master latch 31 is activated with the clock signal CLK set to the "Low" level, and the input data D are transmitted to the node n6. On the other hand, the input data D are not transmitted to the slave latch 32, since the clocked inverter CI2 is deactivated and the NMOS transistors M1, M2 are turned off; data identical to the output data Q are held as the states of the nodes n1 and /n1.

When the clock signal CLK is set to the "High" level, the clocked inverter CI1 is turned off and the clocked inverter CI2 is turned on to hold the states of the nodes n5 and n6. At the same time, the NMOS transistors M1 and M2 are turned on, and the state of the master latch 31 is transmitted to the nodes n1 and /n1 to update and externally outputted as the output data /Q.

In the storing operation (cycles $T_3$-$T_5$), the store enable signal /WE is activated (that is, set to the "Low" level). In response to the activation of the store enable signal /WE, the output of one of the NOR gates NR1, NR2 is set to the "Low" level and the output of the other is set to the "High" level, according to the states of the nodes n1 and /n1. In other words, the magnetization reversal current Iw which complementarily changes the magnetizations of the MTJ elements Jt and Jn flows between the lower terminal n3 of the MTJ element Jt and the lower terminal n3' of the MTJ element Jn in accordance with the state of slave latch 32 (held data). In the timing chart of FIG. 9, the store enable signal /WE is synchronous with the clock signal CLK. That is, in FIG. 9, the store enable signal /WE is activated when the CLK is set to the "Low" level. It should be noted, however, the activation timing of the store enable signal /WE is optional in this embodiment. Since the voltage levels of the nodes n1 and /n1 are switched only at the rising edges of the clock signal CLK, the held data can be stably stored in the MTJ elements Jt and Jn as long as the activation of the store enable signal /WE occurs in the clock cycle.

In the recall operation (cycle $T_6$) as in the first embodiment, the recall enable signal /RE is placed into the activated state ("Low" level) in a state where the clock signal CLK is set to the "Low" level and the store enable signal /WE is in the deactivated state ("High" level). At this time, in the slave latch 32, the NMOS transistors M1 and M2 are turned off, the lower terminals n3 and n3' of the MTJ elements Jt and Jn are grounded, and the NMOS transistor M7 is turned on. At this time, the inputs and outputs of the cross-coupled inverters IV1 and IV2 are short-circuited and the voltages of the nodes n1 and /n1 are set to intermediate voltage levels represented by the expressions (1) and (2). In other words, 1-bit data stored as the magnetization state of the MTJ elements Jt and Jn can be called as complementary voltage levels to the nodes n1 and /n1. When the recall enable signal /RE is deactivated ("High" level), the NMOS transistor M7 is turned off and the potential difference recalled to the nodes n1 and /n1 are amplified to the logical amplitude. The data recalled to the nodes n1 and /n1 are externally outputted as output data /Q. The above-mentioned recall operation is often performed at the power-on. Thus, the 1-bit data stored in the MTJ elements Jt and Jn are transferred as the initial value to the slave latch 32 and the state immediately before the power-off can be recalled.

Figure 8:
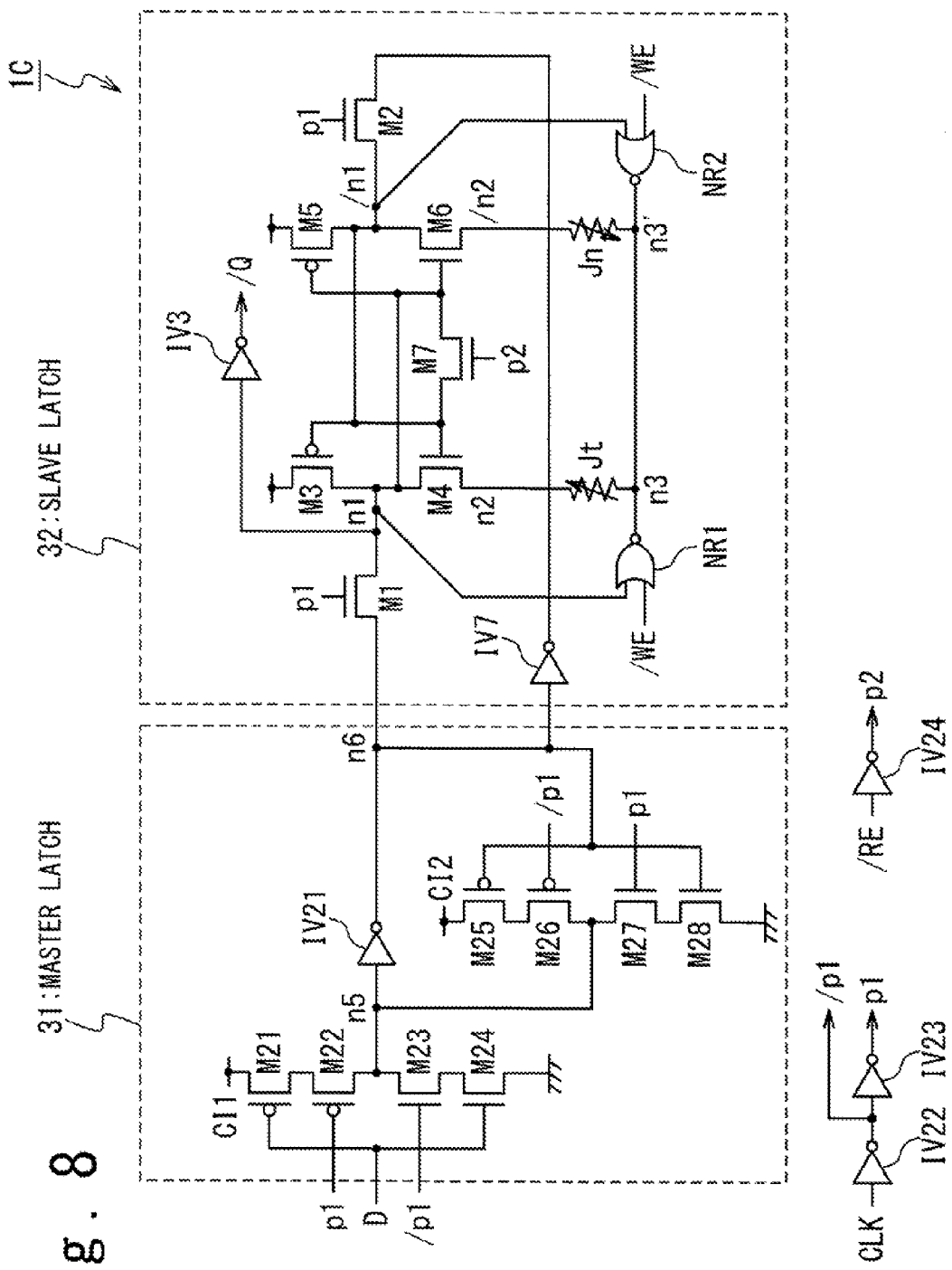
FIG. 8 is a circuit diagram illustrating a configuration of a nonvolatile D flipflop circuit in a second embodiment of the present invention.

Although the second embodiment of the present invention is described in detail, the present invention is not limited to the circuit shown in FIG. 8 and may be appropriately modified within a technical concept of the present invention. For example, the nonvolatile latch circuit in the first embodiment may be apply the master latch 31 with the configuration thereof modified into a low through latch. Alternatively, the nonvolatile latch circuit in the first embodiment may be apply the master latch 31 with the configuration thereof modified into a low through latch, while the high through nonvolatile latch circuit in the first embodiment is applied to the slave latch 32. With such the configuration, the nonvolatile D flipflop circuit is adapted to power-off at any clock timing, since the master latch 31 and the slave latch 32 are both nonvolatile.

Although the present invention is described with reference to the embodiments, the present invention is not limited to the above-mentioned embodiments. Various modifications which could be understood by those skilled in the art may be made in the configuration and details of the present invention within the scope of the present invention.

This application claims the priority based on the Japanese Patent Application No. 2007-316397, filed on Dec. 6, 2007, the disclosure of which is incorporated herein in its entirety by reference.

The invention claimed is:
1. A nonvolatile latch circuit, comprising:
first and second inverters cross-coupled to hold 1-bit data;
first and second magnetoresistive elements each having first to third terminals; and
a current supply circuitry configured to supply a magnetization reversal current for changing magnetization states of said first and second magnetoresistive elements in response to said 1-bit data,
wherein a power terminal of said first inverter is connected to said first terminal of said first magnetoresistive element,
wherein a power terminal of said second inverter is connected to said first terminal of said second magnetoresistive element,
wherein said current supply circuitry is configured to supply said magnetization reversal current to said second terminals of said first and second magnetoresistive elements, and
wherein said third terminal of said first magnetoresistive element is electrically connected to said third terminal of said second magnetoresistive element.

2. The nonvolatile latch circuit according to claim 1, wherein each of said first and second magnetoresistive elements are configured so that a tunnel current flows through a magnetic tunnel junction between said first and second terminals, and said magnetization reversal current flows between said second and third terminals.

3. The nonvolatile latch circuit according to claim 1, further comprising:
a first switch which electrically connects and disconnects outputs of said first and second inverters.

4. The nonvolatile latch circuit according to claim 1, wherein said current supply circuitry is configured to supply complementary voltages to said second terminals of said first and second magnetoresistive elements in response to voltage levels of the outputs of said first and second inverters.

5. The nonvolatile latch circuit according to claim 1, further comprising:
a second switch which supplies input data to an input of said first inverter in response to a clock signal; and
a third switch which supplies inverted data of said input data to an input of said second inverter in response to said clock signal.

6. The nonvolatile latch circuit according to claim 1, wherein said current supply circuitry has first and second input terminals and first and second output terminals,
wherein said first input terminal is connected to the output of said first inverter and said second input terminal is connected to the output of said second inverter, and
wherein said first output terminal is connected to said second terminal of said first magnetoresistive element and said second output terminal is connected to said second terminal of said second magnetoresistive element.

7. The nonvolatile latch circuit according to claim 1, wherein said current supply circuitry has first and second input terminals and first and second output terminals,
wherein said first input terminal is connected to the output of said first inverter and said second input terminal is connected to the output of said second inverter, and
wherein said first output terminal is connected to said second terminal of said second magnetoresistive element and said second output terminal is connected to said second terminal of said first magnetoresistive element.

8. The nonvolatile latch circuit according to claim 1, wherein said current supply circuitry has first and second input terminals and first and second output terminals,
wherein said first input terminal is connected to the output of said second inverter and said second input terminal is connected to the output of said first inverter, and
wherein said first output terminal is connected to said second terminal of said first magnetoresistive element and said second output terminal is connected to said second terminal of said second magnetoresistive element.

\* \* \* \* \*